United States Patent [19]

Lewis et al.

[11] Patent Number: 4,576,659

[45] Date of Patent: Mar. 18, 1986

[54] PROCESS FOR INHIBITING METAL MIGRATION DURING HEAT CYCLING OF MULTILAYER THIN METAL FILM STRUCTURES

[75] Inventors: Robert K. Lewis; Sudipta K. Ray, both of Wappingers Falls, N.Y.

[73] Assignee: International Business Machines Corporation, Armonk, N.Y.

[21] Appl. No.: 446,300

[22] Filed: Dec. 2, 1982

[51] Int. Cl.[4] .................. B23K 31/02; C21D 1/74
[52] U.S. Cl. .................. 148/127; 228/123; 228/179; 228/220; 428/620; 428/672; 428/674
[58] Field of Search .............. 29/590, 589, 577 R, 29/591, 577 C; 148/127; 228/219, 220, 179, 263.12, 123; 428/620, 674, 672

[56] References Cited

U.S. PATENT DOCUMENTS

| | | |
|---|---|---|
| 3,071,854 | 1/1963 | Pighini .................. 228/123 |
| 3,363,308 | 1/1968 | Lueck .................. 29/589 |
| 4,081,601 | 3/1978 | Dinella et al. .................. 174/68.5 |
| 4,176,443 | 12/1979 | Iannuzzi et al. .................. 29/589 |
| 4,179,534 | 12/1979 | Chang et al. .................. 29/590 |
| 4,268,584 | 5/1981 | Ahn .................. 428/620 |
| 4,282,043 | 8/1981 | Chang .................. 428/672 |
| 4,320,412 | 3/1982 | Hynes et al. .................. 428/620 |
| 4,415,375 | 11/1983 | Lederich et al. .................. 148/11.5 F |

FOREIGN PATENT DOCUMENTS

| | | | |
|---|---|---|---|
| 589502 | 2/1970 | Fed. Rep. of Germany . | |
| 2466860 | 4/1981 | France .................. | 29/589 |
| 25355 | 3/1978 | Japan .................. | 29/590 |
| 11436 | 4/1978 | Japan .................. | 29/590 |
| 15235 | 2/1980 | Japan .................. | 428/620 |
| 138255 | 10/1980 | Japan .................. | 29/590 |
| 31913 | 7/1981 | Japan .................. | 428/620 |
| 2061155 | 5/1981 | United Kingdom .......... | 228/263.12 |

OTHER PUBLICATIONS

IBM Technical Disclosure Bulletin, vol. 21, No. 10, Mar. 1979, p. 4244.
IBM Technical Disclosure Bulletin, vol. 13, No. 10, Mar. 1971, pp. 3003-3004.
The Reduction of Au-Al Intermetallic Formation & Electromigration in Hydrogen Environments by Shih et al., IEEE Transactions . . . , vol. ED-26, No. 1, Jan. 1979.

Primary Examiner—Wayland Stallard
Attorney, Agent, or Firm—Sughrue, Mion, Zinn, Macpeak and Seas

[57] ABSTRACT

The formation of metal oxide contaminants on the surfaces of thin metal films by out-diffusion primarily through the grain boundaries thereof of metal from an underlayer is inhibited by conducting heat cycling of such layered metal structures in an ambient gas mixture composed of inert gas, such as nitrogen, containing a sufficient amount of active gas, such as, hydrogen, carbon monoxide, or the like, substantially to suppress such out-diffusion.

10 Claims, 5 Drawing Figures

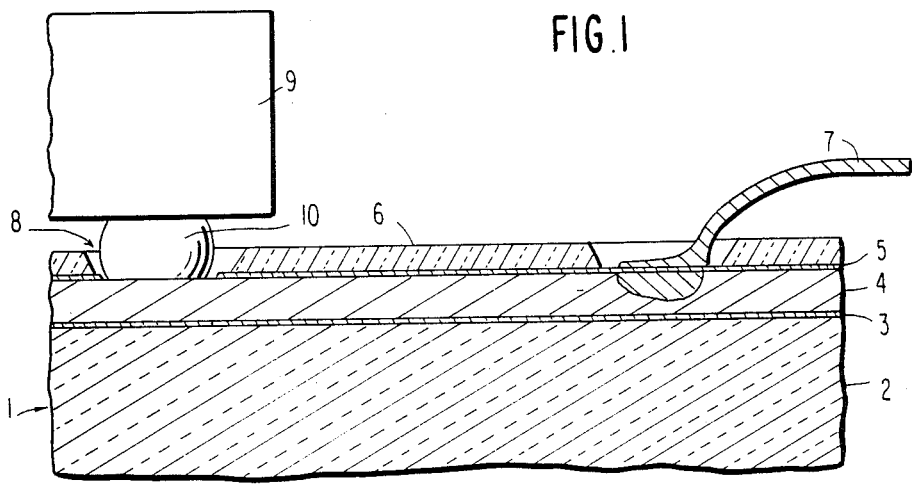
FIG.1
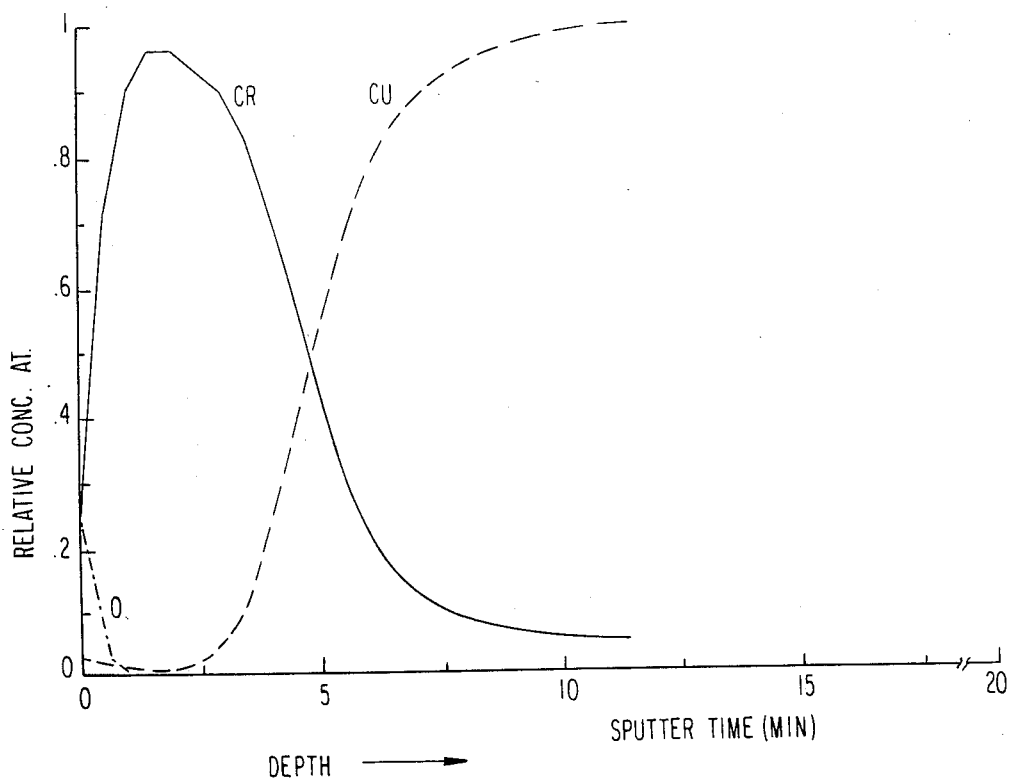
FIG.2  CR/CU 'AS RECEIVED'

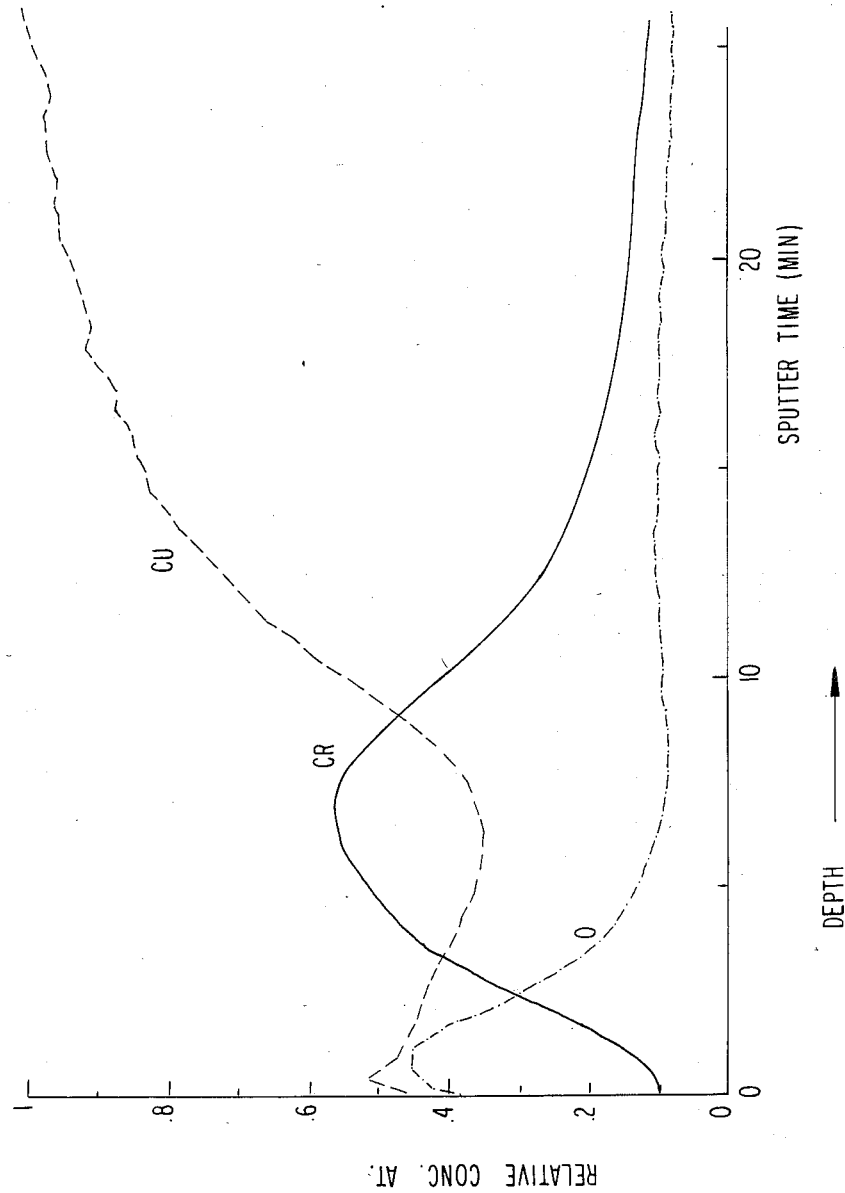

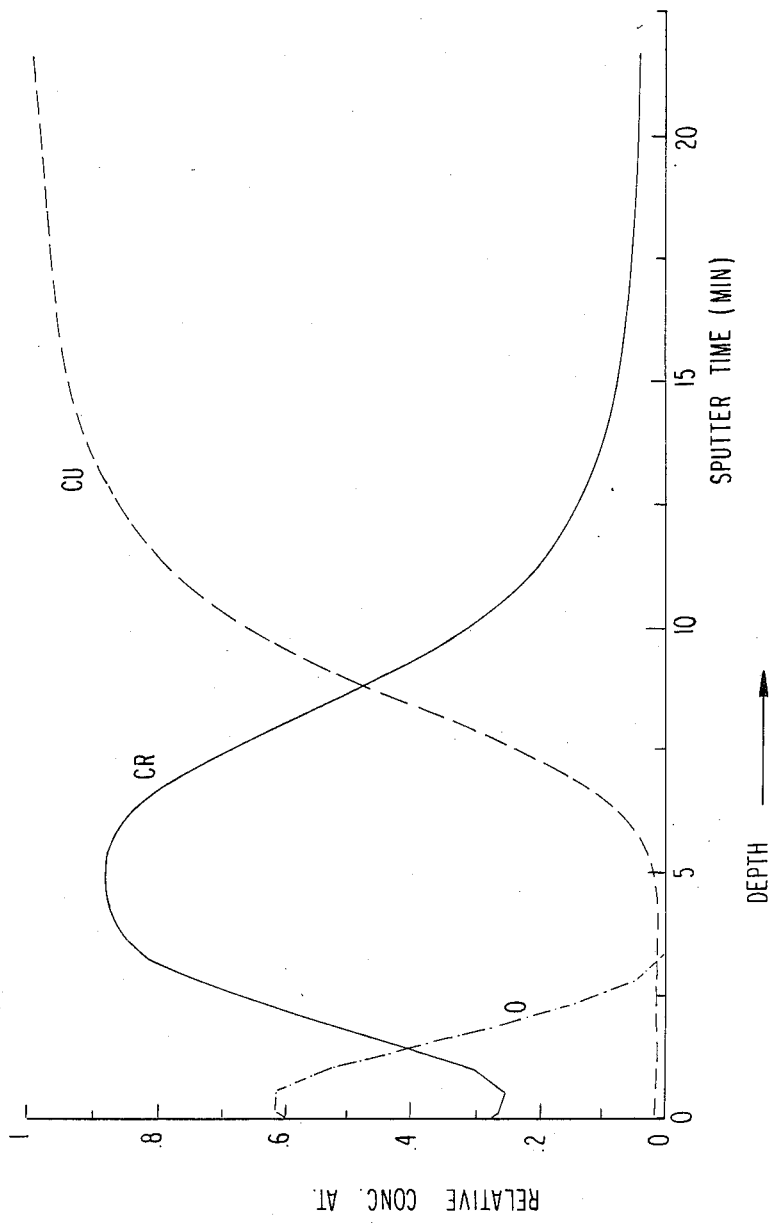

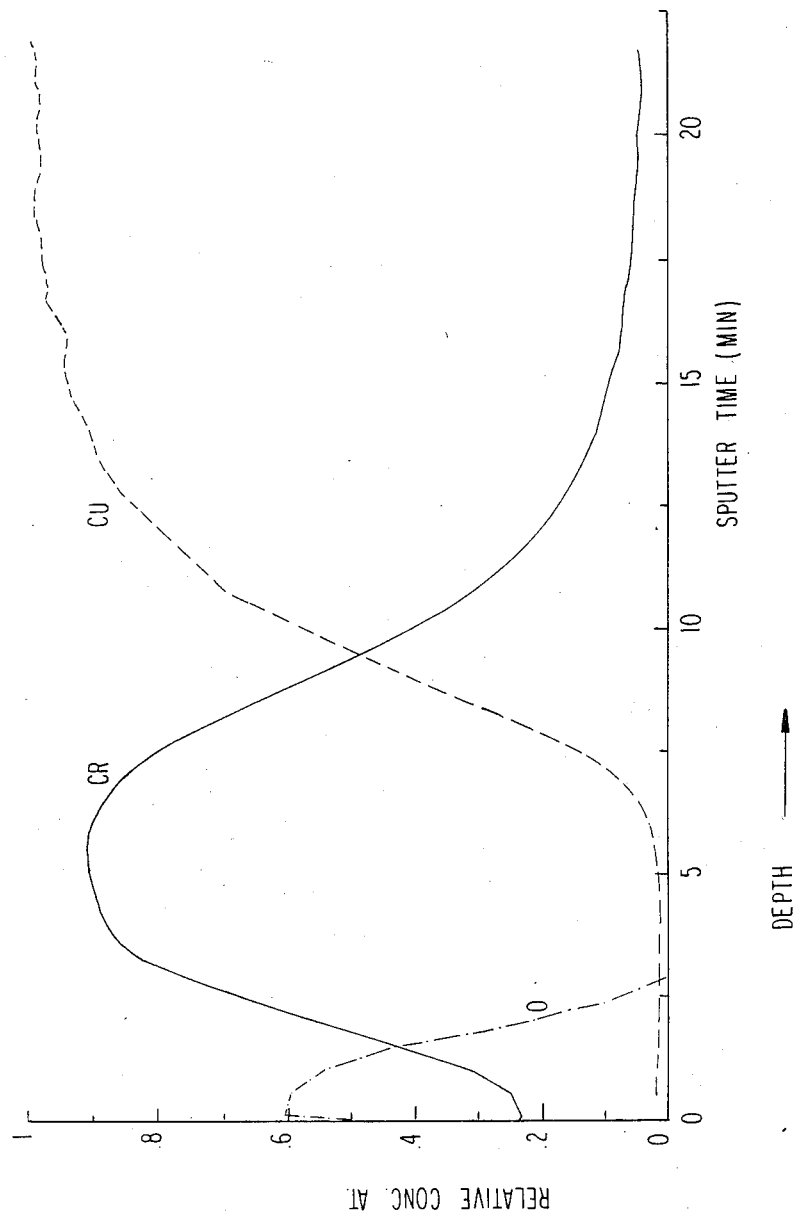

PROCESS FOR INHIBITING METAL MIGRATION DURING HEAT CYCLING OF MULTILAYER THIN METAL FILM STRUCTURES

The invention relates to a process for inhibiting the diffusion of one metal through an overlayer of another metal in thin metal film structures when the structures are subjected to heating. The invention has particular application in the electronics industry for example in the production of integrated circuits where the integrated circuit devices include a plurality of superposed thin metal films or layers and are made by processes involving a multiplicity of heat cycling steps for example pin brazing, chip joining, wire bonding and the like.

DESCRIPTION OF PRIOR ART

In the production of various electronic devices, multilayered thin metal film constructions are frequently employed, such as, chromium-copper-chromium and gold-nickel thin film combinations. It is further desired in using such multilayered thin metal film constructions that an exterior metal surface of the assembly provide a suitable bonding surface for manufacturing operations such as solder bonding, chip joining, pin brazing, wire bonding, etc. However, it has been observed that, during the manufacturing process which often involves the sequential deposition of layers, attachment of chips, brazing of pins, soldering of caps, bonding of wires, etc. are associated with a series of heating steps during which, there takes place diffusion of metal from one of the interior metal layers primarily through the grain boundaries in the thin metal overlayer and onto the exposed surface of that layer. Subsequent oxidation of the diffused metal results in a serious loss of wettability or bondability and an increase in contact resistance of the exposed surface and possible failure of the electronic device being manufactured. This invention teaches a solution to this problem so that it is possible to use certain desirable thin metal layer structures in electronic devices subjected to one or more heating cycles during manufacture.

The prior art disclosures of which we are aware broadly teach the use of gas mixtures as the ambient in furnaces for producing electronic components. See, for example, U.S. Pat. No. 3,071,854, Pighini, which discloses forming gas (15% $H_2$ and 85% $N_2$), and argon, and U.S. Pat. No. 3,363,308, Lueck, which discloses forming gas. Neither Pighini nor Lueck discloses the use of such gases in an environment where thin metal structures are heat cycled under conditions which would promote diffusion of metal from a metal underlayer through and to the surface of an exterior thin metal film.

U.S. Pat. No. 3,513,520, Vandervell, discloses an atmosphere of nitrogen containing hydrogen and carbon monoxide atmosphere is used in a high temperature metal strip forming mill. The metals involved are thick layers and no problems of diffusion of metals through thin layers are presented.

Other U.S. patents generally of interest for disclosure of various industrial processes using reducing atmospheres, such as, forming gas, include: U.S. Pat. Nos. 3,165,828, Kennedy, 3,597,833, Frederick, 3,900,151, Schoer et al, 3,941,299, Godfrey, 4,278,195, Singh, and 4,294,395, Nayar.

In any case, none of the foregoing prior art descriptions have to do with the control of the problem of diffusion of metal from an interior thin layer through an exterior thin layer of metal during heat treatment such that the surface properties of the exterior metal layer are altered in a way unfavorable to the utility of that layer, for example, for the bonding of other materials such as solder, passivation layers, wires, and for maintaining good electrical contact.

DESCRIPTION OF THE DRAWINGS

In the drawings FIG. 1 is a partial cross-sectional view of a portion of an illustrative electronic device containing a plurality of contacting thin films or layers of metal wherein the outermost film or layer provides a surface with which various materials are to be bonded or joined or on which materials are to be deposited. FIGS. 2-5, inclusive, are Auger depth profiles which graphically illustrate the concentration of metals of various depths in multilayer thin metal film constructions at certain stages, e.g., as deposited, and after thermal cycling in selected atmospheres.

SUMMARY OF INVENTION

In accordance with the present invention, it has been found that a structure comprising a plurality of thin metal films or layers which mutually contact one another can be processed through one or more heating steps or cycles without deterioration of an exposed or exterior thin metal surface layer, due to diffusion of metal from an interior layer and subsequent oxidation of the diffused metal, by conducting the heating step or steps in an atmosphere comprising nitrogen or argon admixed with an active gas such as hydrogen, carbon monoxide, etc.

DETAILED DESCRIPTION OF THE INVENTION

In the production of electronic devices, thin metal layers are frequently used to provide conductive paths, bonding surfaces or other physical and functional elements of a device. Often the thin metal layers are superimposed one on top of the other. In the fabrication of certain devices for example a chromium-copper-chromium layer arrangement is utilized and in other devices a gold-nickel arrangement of layers is utilized. It is also expected, although it has not yet been demonstrated, that the advantages of this invention can be realized with other metal film structures, such as titanium-copper-titanium, gold-coated KOVAR alloy and copper coated with a thin layer of cobalt.

The manufacture of electronic devices often involves the sequential deposition of layers, attachment of chips, brazing of pins, soldering of caps, bonding of wires, etc., associated with which are a series of heating cycles. Even though the heating steps are often at relatively low temperatures, for example 200°–400° C., the metal layers are sufficiently thin so that metal from an interior layer may diffuse primarily through the grain boundaries of a thin metal overlayer to the exposed surface of the layered metal construction, thereby contaminating the surface by the presence of the metal or its oxidation products. For example, in a chromium-copper-chromium assembly of thin metal layers, the copper may diffuse through the thin chromium surface film during a heating cycle to reach the exposed surface of the chromium and oxidize, thus contaminating the surface of the chromium with copper and its oxides. Similarly nickel from an underlayer in a gold-nickel thin metal assembly has been observed to diffuse through the thin gold outer layer and result in the formation of nickel and its oxide contaminants on the surface of the gold. In both cases the wettability of solder, adhesion of passivation layers and bondability of wires to the chromium, gold or other exterior metal surface is seriously deteriorated.

It has now been found that the diffusion of metals from interior metal layers through thin metal outer layers may be substantially inhibited by conducting the heating cycles of such thin metal layered structures or assemblies in an atmosphere of a mixture of an inert gas, such as nitrogen, argon, or the like, and an active gas, such as hydrogen, carbon monoxide or the like.

Surprisingly excellent results can be obtained using a very small proportion of active gas; for example, as little as 0.1% of hydrogen has been found to be effective. While the invention has not been practiced using other active gases, it is believed that these will function in a similar manner and it is believed that carbon monoxide, or other gases will function in a relatively comparable manner. For example, it is expected that other inert gases such as argon mixed with a low concentration of hydrogen will inhibit out diffusion.

By thin metal films or layers in terms of the present invention, one is concerned with layers of a thickness generally measured in the range of up to a few thousand angstroms, with the outer metal film thickness being in the range of 500 to 2000 Å. For example, a chromium-copper-chromium assembly may involve an outer chromium layer with a typical thickness of 1,000 Å, a copper core of 5 to 10 microns and another chromium layer of about 1,000 Å in thickness. The layers may be produced by any conventional thin film metal depositing technique, such as, vacuum evaporation, sputtering, electroless or electrolytic plating.

Objects of the invention therefore include inhibiting diffusion of metal from an underlying layer through a thin protective upper layer and any subsequent oxidation during heating cycles so as to improve wettability by solder, to improve the adhesion of passivation layers or other overcoat layers to the exterior of the thin metal surface layer, to improve the bondability of wires on the surface of the metal, etc. All of these contribute to the improvement in the ease of fabrication and reliability of structures which comprise such multilayer thin metal assemblies and which are subjected to multiple heating cycles.

The invention can be better appreciated by reference to the drawings. In FIG. 1 a cross-section of an illustrative electronic device including a plurality of thin metal layers is shown. The device 1 is shown to comprise a substrate 2 which may typically be polyimide, glass, ceramic, etc. A first thin layer of metal 3, such as chromium, is applied to the substrate to promote adhesion to the underlying dielectric. This layer would often be of a thickness on the order of 1,000 Å. Next, a second metal layer 4, such as, a copper layer, typically from about 5 to 10 microns in thickness, is applied over the first metal film or layer 3, chromium in this illustration. This copper layer provides a conductive path within the device. Next a surface thin metal layer 5, e.g., a chromium layer about 1,000 Å in thickness, is applied over the copper. Over this assembly there may then be applied a dielectric coating 6 which for example may be polyimide, $Si_3N_4$, $SiO_2$, etc. Portions of the uppermost thin metal layer 5 are exposed for the purpose of attaching an electrically conductive wire 7, and may also be partially removed for the purpose of providing a site for chip joining 8. For example, the chip 9 may be attached by a metal solder ball 10 to the exposed copper core by a soldering process in which case the chromium layer provides a solder stop or dam to prevent the solder ball from spreading beyond the desired area of the joint during the soldering step. The solder ball typically may consist of lead-tin or lead-indium alloys and are joined to the exposed copper or gold surfaces by reflowing the solder in a furnace in the temperature range 200°–360° C.

As noted previously, if the sequential solder reflow, chip joining, pin brazing and other operations utilized in the manufacture of integrated circuits are carried out on structures incorporating thin metal surface films through which metal from an underlayer may diffuse without taking advantage of the present invention, it has been observed that metal from underlayers will migrate or diffuse through the thin metal outer layer and produce contaminating metal and its oxides on the exposed surface, e.g., copper or nickel and their oxides on the exterior surface. In the case of the chromium upper layer, this results in the deterioration of the ability of such surface to serve as a solder stop or dam. It can also reduce the adhesiveness of a dielectric overcoat. The presence of the metal oxides can further reduce the bondability of wires through the thin metal surface film of chromium and into the underlying copper layer by serving as a passivation layer and keeping the copper free from copper oxide.

While the foregoing description has been in terms of a chromium-copper-chromium assembly of layers, the advantages of the present invention will be realized in the case of other combinations of thin metal layers for example an assembly of gold over nickel, or gold coated KOVAR contact surfaces. In the former case, the presence of nickel oxide adversely impacts the wettability by lead-tin solders whereas in the latter case the presence of metallic oxides on top of gold may prevent good electrical contact to other mating surfaces.

An understanding of the present invention will be further assisted by reference to the following examples.

EXAMPLE 1

A fine grain ceramic substrate was provided and chromium, copper and chromium layers having a thickness of 800 Å, 10 microns and 1,000 Å, respectively, were vacuum evaporated in sequence by conventional procedures onto the surface of the ceramic substrate. The as deposited sample was then analyzed using the Auger depth profile method to establish that there were clear separations between the top chromium layer and the underlying copper layer. The resulting profile is shown in FIG. 2. As can be seen, the as evaporated copper below the top chromium layer is free of oxides. The Auger depth profile is an analytical method for studying surface and subsurface regions of metal films for oxides, contaminants, etc. The method has been discussed by P. Holloway in a paper "Fundamentals and Applications of Auger Spectroscopy" published in Advances in Electronics and Electron Physics, Vol. 54, pp. 241-298, 1980. This structure is readily bondable ultrasonically with 1.5 mil diameter gold coated copper wire.

EXAMPLE 2

Next a portion of the substrate as described in Example 1 was heat treated at 360° C. for three hours in a nitrogen atmosphere. The Auger depth profile analysis for the sample clearly showed that the copper had diffused out to the surface of the chromium. The depth profile (FIG. 3) also shows that there is no longer a clear separation between the chromium and copper layers, and the copper on the top surface is oxidized. The diffusion of copper onto the surface and subsequent or concurrent oxidation of the copper caused wire bonding problems.

EXAMPLE 3

The procedure of Example 2 was followed except samples of the substrate were heat treated at 360° C. for three hours in a nitrogen atmosphere containing:
 (a) 0.1% hydrogen;
 (b) 1% hydrogen;
 (c) 2.5% hydrogen; and
 (d) 5% hydrogen.

The Auger depth profiles for these samples indicate that at all concentrations tested the presence of the active gas totally suppresses the out diffusion of copper through chromium to the top surface. Auger depth profiles for the cases (a) and (c), above, are shown in FIGS. 4 and 5, respectively. It can be concluded that even after long heat treatments in these gas mixtures, the separation between the chromium and copper layers is maintained and the chromium layer is generally free of copper. Therefore, the chromium outer surface retains its wire bondability, solder stop or damming quality, adhesiveness to any overlying dielectric and continues to function effectively as a passivation layer for the copper. It has been experimetally determined that the chromium-copper-chromium metallurgy remains ultrasonically wire bondable after being processed through multiple chip joining (by solder reflow) cycles and temperature storage in a nitrogen atmosphere containing 1 to 2% hydrogen. The results are shown in Table I.

TABLE 1

BONDABILITY AFTER MULTIPLE REFLOW CYCLES AND TEMPERATURE STORAGE IN REDUCING $N_2$ [$N_2$ + (1-2)% $H_2$] (SAMPLE: CR: CU: CR: ON CERAMIC)

| # REFLOWS | AVERAGE BOND PULL STRENGTHS* (GM) | FAILURE MODE |
|---|---|---|
| 0 | 27.0 ± 2.5 | NUGGET |
| 10 | 25.5 ± 2.4 | " |
| 20 | 26.1 ± 2.3 | " |
| 30 | 26.4 ± 3.1 | " |
| 40 | 25.8 ± 2.2 | " |
| 2 HOURS AT 360° C. | 25.2 ± 1.9 | " |

*AVERAGE FROM 30-40 LOOP PULL TESTS

The same advantage of using the nitrogen doped with a small concentration of hydrogen during heating cycles was found to be applicable for the nickel-gold metallurgy as described below.

EXAMPLE 4

A 3 to 5 microns thick layer of nickel followed by 500 to 1,500 Å thick layer of gold were sequentially deposited by conventional electroless metal plating procedures over a molybdenum surface on a ceramic substrate. A short (5 to 10 minutes) heat treatment is done at a high temperature (550° to 600° C.) in pure hydrogen atmosphere to initiate limited interdiffusion between the gold and nickel so that a desirable gold to nickel ratio equal to or greater than 5 is produced at the gold surface. This surface is found to be readily wettable by a 60/40 tin/lead solder.

EXAMPLE 5

A portion of the substrate as described in Example 4 was heat treated in a nitrogen atmosphere at 400° C. for one hour. The Auger depth profile analysis showed that nickel had diffused to the gold surface aided by nickel oxidation. As a result, the gold to nickel ratio at the surface was reduced drastically from 5 to 0.2. This surface could not be wetted by the 60/40 tin/lead solder.

EXAMPLE 6

The procedure of Example 5 was followed except that the sample was heated in a nitrogen atmosphere containing 1 to 2% hydrogen. The Auger depth profile of this sample indicated that no nickel out diffusion to the gold surface took place as a result of the heat treatment. The gold to nickel ratio at the surface was greater than 5. This surface was perfectly wettable by 60/40 tin/lead solder. In other words, the integrity and quality of the gold-nickel metallurgy was maintained by conducting the heat treatment in the hydrogen doped nitrogen atmosphere.

As a cautionary note in connection with the use of hydrogen, it should be mentioned that a hydrogen concentration above about 4% in oxygen may be explosive and thus special safety precautions will be required in dealing with higher concentrations of hydrogen. However, since it has been found that very satisfactory results are achieved with very low hydrogen concentrations, for example below 5% and as low as 0.1% in nitrogen, it would seem unnecessary to work with a hydrogen concentration in a dangerous range. As a result, this gas mixture is readily implementable in a manufacturing furnace without requiring extensive safety measures.

While the foregoing examples and discussion enable one to utilize the invention in connection with specific metallurgical systems and ambient gas atmospheres, it will be apparent to those of skill in the art that the principles of our invention may be extended to other metals and gas compositions without departing from the spirit of the invention or the scope of the following claims.

We claim:

1. A process for inhibiting the diffusion of metal from a metal underlayer through a thin metal overlayer when the two layers, while in contact, are heated in the temperature range of 200°-400° C., comprising conducting said heating in the presence of an ambient gas mixture comprising an inert gas and an amount of active gas sufficient substantially to prevent metal from the underlayer from diffusing through to the surface of the thin metal overlayer and onto the surface of the metal overlayer during said heating, wherein said active gas is hydrogen and is present in the mixture in a concentration of from about 0.1% up to less than 4%, wherein the thickness of the overlayer is in the range of 500 to 2,000 Å and the underlayer has a thickness of from 50,000 to 100,000 Å, wherein the underlayer and overlayer combinations are selected from the group consisting of copper coated with cobalt, copper coated with chromium and copper coated with titanium.

2. The process of claim 1, wherein said inert gas is nitrogen.

3. The process of claim 1, wherein said inert gas is argon.

4. The process of claim 2, wherein said overlayer is chromium and said underlayer is copper.

5. The process of claim 2, wherein said overlayer is titanium and said underlayer is copper.

6. The process of claim 2, wherein said underlayer is copper and said overlayer is cobalt.

7. In a process for the manufacture of electronic devices, wherein two or more metal layers are deposited one over the other and an outermost thin metal layer is provided which requires good bondability and wetability for metallurgical bonding procedures such as brazing, soldering, wire bonding and maintaining good electrical contact, and wherein one or more heating cycles during the manufacture of the device in the temperature range of 200°–400° C. is used, the improvement comprising conducting said heating cycles in an ambient gas atmosphere comprising a mixture of an inert gas and a smaller proportion of active gas sufficient to prevent metal from an underlying layer from diffusing through to the surface of the thin metal overlayer wherein said inert gas is nitrogen and said active gas is hydrogen with a hydrogen concentration of less than 4%, wherein of said two or more metal layers the outermost metal layer has a thickness of from 500 to 2,000 Å and the metal layer thereunder has a thickness of from 50,000 to 100,000 Å, wherein the outermost thin metal layer and metal layer thereunder combinations are selected from the group consisting of copper coated with cobalt, copper coated with chromium and copper coated with titanium.

8. The process of claim 7, wherein said overlayer is chromium and said underlayer is copper.

9. The process of claim 7, wherein said overlayer is titanium and said underlayer is copper.

10. The process of claim 7, wherein said overlayer is cobalt and said underlayer is copper.

* * * * *